(12) United States Patent
Shimoirisa et al.

(10) Patent No.: US 8,031,481 B2
(45) Date of Patent: Oct. 4, 2011

(54) STRUCTURE FOR MOUNTING PRINTED BOARD AND NUCLEAR MEDICINE DIAGNOSIS SYSTEM

(75) Inventors: Takahiro Shimoirisa, Hadano (JP); Atsumi Kawata, Hiratsuka (JP); Fusaaki Kozawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 841 days.

(21) Appl. No.: 11/818,447

(22) Filed: Jun. 13, 2007

(65) Prior Publication Data
US 2008/0007895 A1    Jan. 10, 2008

(30) Foreign Application Priority Data
Jun. 15, 2006  (JP) ................................. 2006-165466

(51) Int. Cl.
*H05K 7/14* (2006.01)
(52) U.S. Cl. ........ 361/797; 361/736; 361/798; 361/801; 361/802
(58) Field of Classification Search .................. 361/721, 361/723, 797, 798, 736; 250/363.03
See application file for complete search history.

(56) References Cited

U.S. PATENT DOCUMENTS

| | | | |
|---|---|---|---|
| 3,644,868 A * | 2/1972 | Nevala | 439/61 |
| 5,617,307 A * | 4/1997 | Guigueno | 363/37 |
| 5,715,146 A * | 2/1998 | Hoppal | 361/796 |
| 6,628,525 B2 * | 9/2003 | Miller et al. | 361/756 |
| 7,217,931 B2 | 5/2007 | Ueno et al. | |
| 2004/0201972 A1 * | 10/2004 | Walesa | 361/788 |
| 2005/0230630 A1 * | 10/2005 | Yanagita et al. | 250/370.09 |
| 2006/0065848 A1 * | 3/2006 | Ueno et al. | 250/370.15 |

FOREIGN PATENT DOCUMENTS

| | | |
|---|---|---|
| JP | 01-165687 A | 11/1989 |
| JP | 06-13195 A | 2/1994 |
| JP | 06-164168 A | 6/1994 |
| JP | 11-017367 A | 1/1999 |
| JP | 11-186708 | 7/1999 |
| JP | 2001-007572 | 1/2001 |
| JP | 2005-106805 | 4/2005 |
| JP | 2005-201671 A | 7/2005 |

OTHER PUBLICATIONS

Japan Patent Office office action for patent application JP2006-165466 (Nov. 24, 2010).

* cited by examiner

*Primary Examiner* — Tuan T Dinh
*Assistant Examiner* — Steven Sawyer
(74) *Attorney, Agent, or Firm* — Kilpatrick Townsend & Stockton LLP

(57) ABSTRACT

The present invention is provided a structure for mounting a printed board in which each connector that is attached to each of a plurality of sub printed boards, which are juxtaposed to one another with respect to a main printed board secured to a metal backboard, is inserted into each of a plurality of connectors that are juxtaposed to one another on the main printed board so that the sub printed boards are mounted on the main printed board by the connector connections. Parts of both ends of an area in proximity to a semiconductor-device mounted area on each of the sub printed boards ate pinched between a first metal frame and a second metal frame so that each of the sub printed boards are secured.

6 Claims, 3 Drawing Sheets

STRUCTURE FOR MOUNTING PRINTED BOARD AND NUCLEAR MEDICINE DIAGNOSIS SYSTEM

BACKGROUND OF THE INVENTION

The present invention relates to a structure for mounting a printed board, in which a multiplicity of printed boards (sub substrates), which are juxtaposed to each other, are connected and mounted to a main printed board that is secured to a backboard, each of the printed boards including an electronic part area on which a plurality of electronic parts are mounted, and a semiconductor device area on which a plurality of semiconductor devices are mounted. The present invention also relates to an electronic apparatus (for example, a nuclear medicine diagnosis system having an observation unit such as a PET (Positron Emission Tomography) system and a SPECT (Single Photon Emission Computer Tomography) system) having the structure for mounting a printed board.

Conventional structures for mounting a printed board are known by JP-A-2001-7572 (patent document 1) and JP-A-11-186708 (patent document 2). According to the patent document 1, when a plurality of printed boards are mounted inside a case whose printed board entrance is opened, a pair of guide rails for guiding a pair of edges of each printed board, which are opposed to each other, are attached in rows in the case of an electronic apparatus so that the pair of guide rails are opposed to the case. Here, the distance from a start point of the pair of guide rails to the entrance of the printed board differs from one another; and the edges of a rail member constituting the guide rail, on the start point side, expand in a direction in which the edges are spaced away from each other. In addition, according to the patent document 2, in a mounting method for mounting a printed board relating to electric parts that require electromagnetic shielding, soldering paste is applied to the printed board, and then the electric parts are mounted on the printed board. Moreover, a shield case is attached on the printed board. The shield case has a box shape whose bottom is opened to cover the electric parts from the top, and is provided with the clearance between the shield case and the printed board at a plurality of points. Then, hot air is put into the clearance at least at one of the points, and the hot air is then exhausted from the clearance at least at another point, and thereby the electric parts and the shield case are soldered with the soldering paste.

On the other hand, a PET (Positron Emission Tomography) system, which is electronic apparatus having a plurality of unit substrates each including semiconductor devices that are mounted in matrix, is known by JP-A-2005-106805 (patent document 3). The patent document 3 discloses a nuclear medicine diagnosis system such as a PET system. The PET system includes a support member, and a plurality of detector units that are attached to the support member in a manner that the detector units can be freely removed. Each of the detector units includes a housing member, and a plurality of unit substrates that are housed in the housing member in a manner that the unit substrates can be freely removed. Each of the unit substrates includes a first substrate and a second substrate. The first substrate includes a plurality of semiconductor radiation detectors, each of which detects a radioactive ray generated by chemical solution that has been injected into the body of a subject. The second substrate includes an integrated circuit for processing a radioactive-ray detection signal that is output from each of the multiplicity of semiconductor radiation detectors. The integrated circuit includes: an analog integrated circuit for processing a signal output from the semiconductor radiation detector; an A/D converter for converting an analog signal, which is the output of the analog integrated circuit, into a digital signal; and a digital integrated circuit for inputting a signal output from the A/D converter. The PET system further includes a counting device that inputs each output from the integrated circuit, and that calculates in pairs the output corresponding to a pair of radioactive-ray detection signals detected during the setup time. The PET system creates tomogram information by use of calculation information output from the counting device.

SUMMARY OF THE INVENTION

For example, as described in the patent document 3, in the case of electronic apparatus such as a nuclear medicine diagnosis system in which a detector unit is attached to a support member in a manner that the detector unit can be freely removed from the supported member, the detector unit having a plurality of printed boards, each of which includes semiconductor devices (for example, semiconductor radiation detectors) that are mounted thereon in matrix, parts including the semiconductor devices (for example, the semiconductor radiation detectors) to be mounted on the printed boards are more and more requested to be mounted with the high location accuracy.

However, as described in the patent document 1, in the case of the guide rail structure for fitting a printed board into a case, the printed board will not slide in a groove unless the groove width of the guide rail is kept wider than the board thickness of the printed board so that some backlash is produced. However, the backlash produced in this manner causes the printed board to warp, which lowers the location accuracy of the printed board. This creates a problem that it is not possible to achieve the location accuracy required for the semiconductor devices (for example, the semiconductor radiation detectors).

In addition, because the semiconductor devices (for example, the semiconductor radiation detectors) are easily subject to electromagnetic noise, dust, and heat, it is necessary to provide a boundary between each semiconductor device and each electronic part disposed on the same printed board (for example, an integrated circuit for processing a radioactive-ray detection signal (including an analog integrated circuit, an A/D converter, and a digital integrated circuit)), and between each semiconductor device and the outside, so as to protect the semiconductor devices against them.

However, even if the shield case as described in the patent document 2 is used for the protection of the semiconductor devices, the space between each semiconductor device and each semiconductor device mounted on an adjacent printed board is narrow, and the high voltage is applied to the semiconductor devices. Accordingly, the electricity is discharged to the shield case, which is also the problem to be solved.

In addition, because the semiconductor devices (for example, the semiconductor radiation detectors) are also easily subject to vibrations, it is necessary to protect the semiconductor devices against vibrations including mechanical vibrations in a system, and earthquake waves. Therefore, it is desired to secure an end face in proximity to the semiconductor devices on the printed board. However, it is not possible to keep the sufficient space for providing fixation mechanism with sheet metal and resin. This is also the problem to be solved.

The present invention has been made to solve the problems, and an object of the present invention is to provide a structure for mounting a printed board in which semiconductor devices, each of which is capable of detecting or transmitting a light beam, an electromagnetic wave, vibrations, and the like, can be mounted on a printed board with high location accuracy, and electronic apparatus having the structure for mounting a printed board, such as a nuclear medicine diagnosis system.

In addition, another object of the present invention is to provide a structure for mounting a printed board, which enables electromagnetic shielding, and protection against dust, heat, and vibrations, and electronic apparatus having the structure for mounting a printed board, such as a nuclear medicine diagnosis system.

In order to achieve the above-mentioned objects, according to one aspect of the present invention, there is provided a structure for mounting a printed board, in which each connector that is attached to each of a plurality of sub printed boards, which are juxtaposed to one another with respect to a main printed board secured to a metal backboard, is inserted into each of a plurality of connectors that are juxtaposed to one another on the main printed board so that the sub printed boards are mounted on the main printed board by the connector connections. Parts of both ends of an area in proximity to a semiconductor-device mounted area on each of the sub printed boards are pinched between a first metal frame and a second metal frame so that each of the sub printed boards are secured.

To be more specific, the structure for mounting a printed board according to the present invention is characterized by the following points: each of the sub printed boards has on the leading end side a semiconductor device area on which a plurality of semiconductor devices are mounted, and has on the trailing end side an electronic part area on which a plurality of electronic parts are mounted; the metal backboard is integrally provided with a first metal frame in which comb-teeth-shaped grooves are formed corresponding to the plurality of sub printed boards that are juxtaposed to one another, and a second metal frame in which comb-teeth-shaped grooves are formed corresponding to the plurality of sub printed boards that are juxtaposed to one another, the second metal frame facing the first metal frame; and when the connector of each of the sub printed boards is connected to each connector on the main printed board, part of one end of each of the sub printed boards is fitted into each of the comb-teeth shaped grooves of the first metal frame, and part of the other end of each of the sub printed boards is fitted into each of the comb-teeth shaped grooves of the second metal frame, and then with the both ends of each of the sub printed boards being pinched between the first metal frame and the second metal frame, the second metal frame is secured to the metal backboard by use of fastening means.

In addition, according to the present invention, a metal plate and an electromagnetic shielding material are provided in an area in proximity to the boundary between the electronic part area and the semiconductor device area included in each of the sub printed boards so that the space between the adjacent sub printed boards are filled up with the metal plate and the electromagnetic shielding material. As a result, boundaries are formed between the electronic part area and the semiconductor device area, and between the adjacent sub printed boards. In addition to it, by covering with the metal cover the semiconductor device areas of the plurality of sub printed boards, a boundary with the outside is formed. This makes it possible to completely protect the semiconductor devices against the electromagnetic force, dust, and heat.

Moreover, according to the present invention, by providing the narrow space between the metal cover and the leading end of each of the sub printed boards with rubber that is easy to become deformed, and then by pressing the leading end of each of the sub printed boards so that the leading end crawls into the vibration protection rubber, it becomes possible to protect the semiconductor devices against vibrations.

Further, according to another aspect of the present invention, there is provided a nuclear medicine diagnosis system including an observation unit for observing a radioactive ray emitted from a subject, and for performing tomographic diagnosis, wherein: the observation unit has the structure for mounting a printed board; and each of the sub printed boards includes a semiconductor device area on which a semiconductor radiation detector group is mounted, the semiconductor radiation detector group being constituted of a plurality of arrayed semiconductor radiation detectors, each of which detects the radioactive ray; and each of the sub printed boards includes an electronic part area that is mounted with circuits including: an analog integrated circuit for at least amplifying a radioactive-ray detection signal that is output from each of the semiconductor radiation detectors; an analog-digital hybrid circuit having an ADC circuit for converting the amplified radioactive-ray signal into a digital radioactive-ray signal; and a digital signal circuit for generating integration information including radioactive-ray information obtained from the analog-digital hybrid circuit, detection-time information about the detection time at which the radioactive ray has been detected, and detector-ID information about an ID of a detector that has detected the radioactive ray.

According to the present invention, it is possible to collectively correct warping of the plurality of sub printed boards, each of which is mounted with a multiplicity of semiconductor devices such as semiconductor radiation detectors. As a result, it becomes possible to mount the multiplicity of semiconductor devices such as the semiconductor radiation detectors with high location accuracy through each of the sub printed boards.

In addition, although semiconductor devices such as semiconductor radiation detectors are subject to the influence of the electromagnetic force, dust, heat, and vibrations, the present invention makes it possible to achieve electromagnetic shielding of the semiconductor devices, and to protect the semiconductor devices against dust, heat, and vibrations.

DESCRIPTION OF PREFERRED EMBODIMENTS

Embodiments of a nuclear medicine diagnosis system (for example, a PET (Positron Emission Tomography) system or an SPECT (Single Photon Emission Computer Tomography) system) having an observation unit, which is an electronic apparatus having a structure for mounting a printed board according to the present invention, will be described with reference to drawings.

First Embodiment

Figure 1:
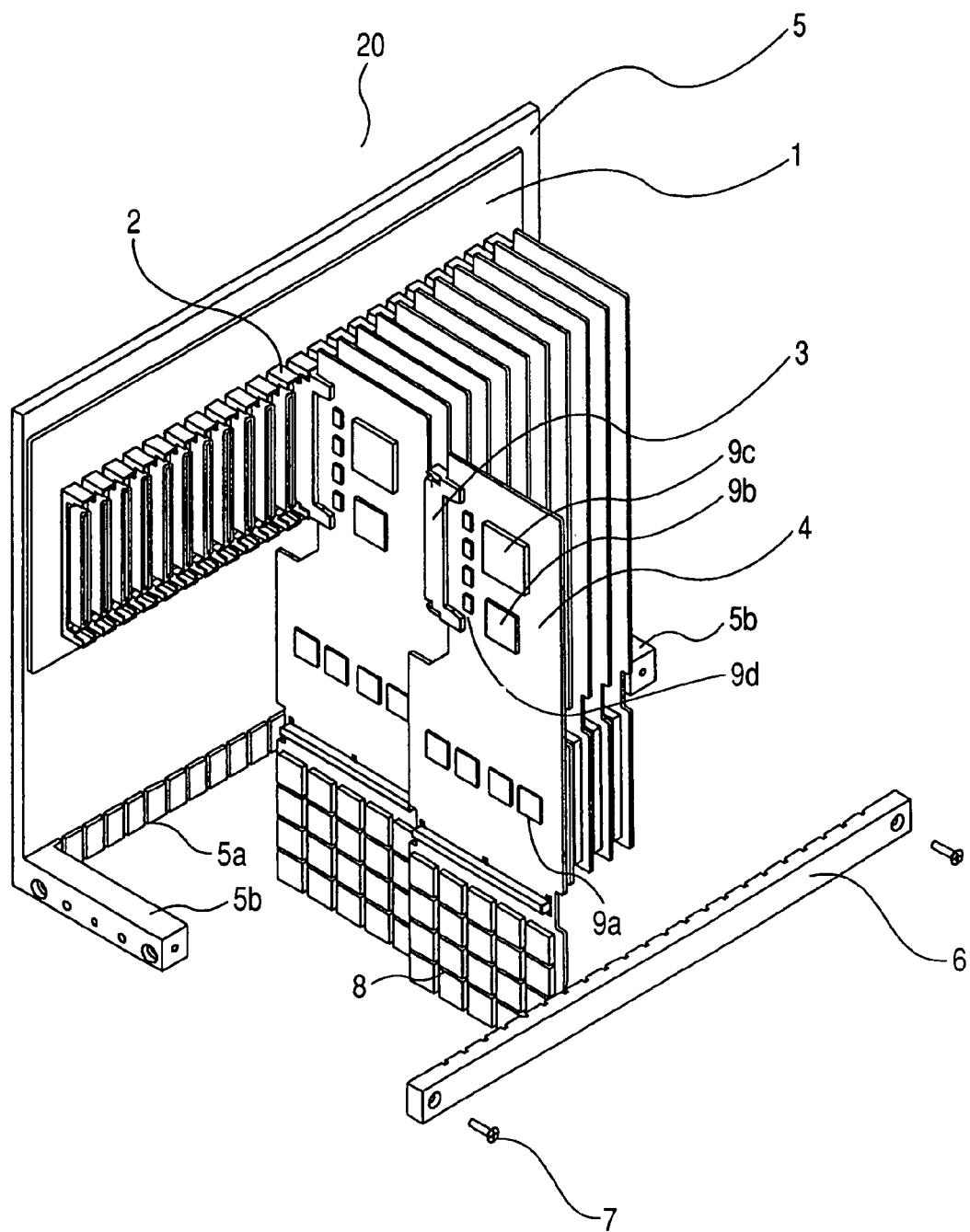
FIG. 1 is a perspective view illustrating a structure for mounting a printed board according to a first embodiment of the present invention, and is also a perspective view illustrating a nuclear medicine diagnosis system (for example, a PET system or a SPECT system) having the structure for mounting a printed board according to a second embodiment of the present invention.
Figure 2:
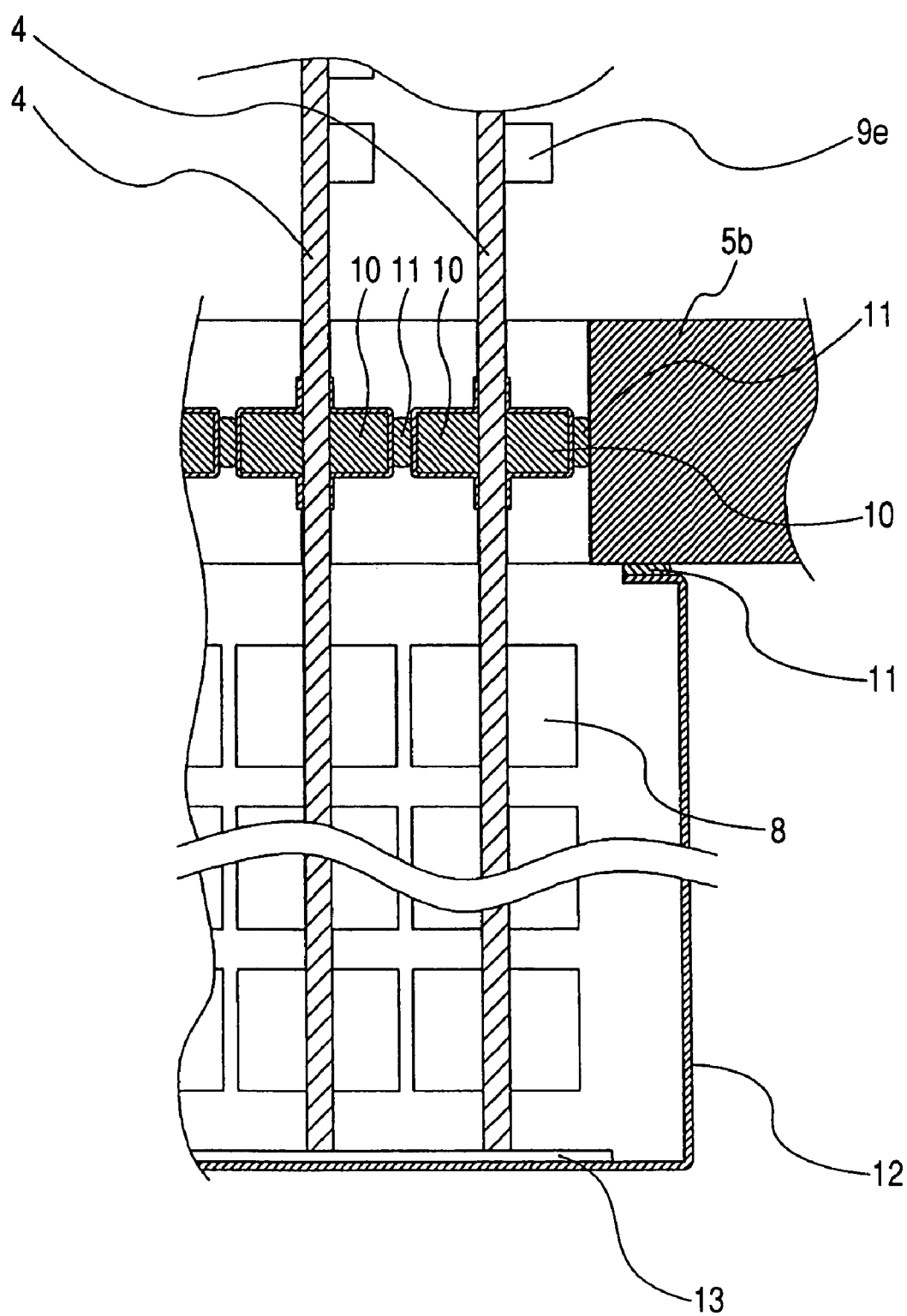
FIG. 2 is a partially sectional view showing a plurality of sub printed boards viewed from the board width direction, the partially sectional view corresponding to an important part of FIG. 1.
Figure 3:
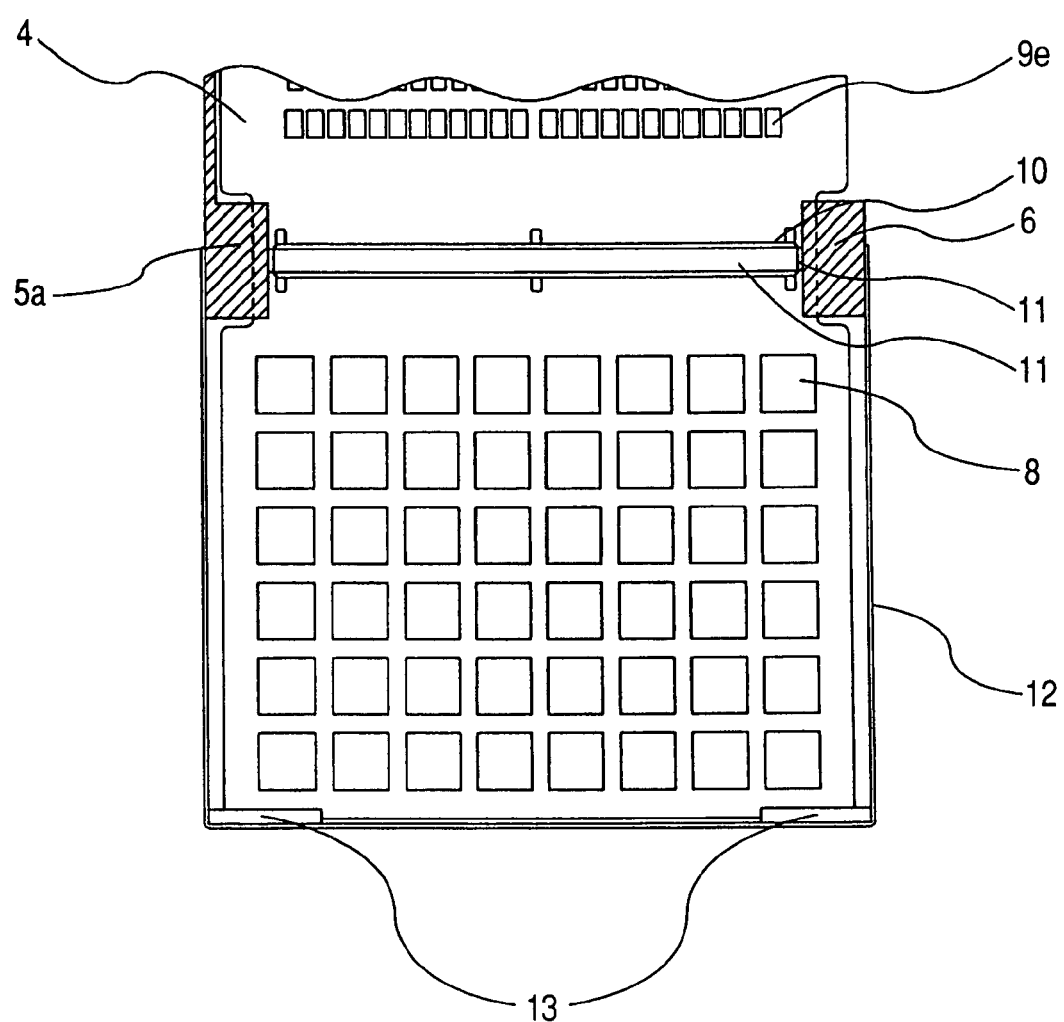
FIG. 3 is a diagram of a sub printed board viewed from the part mounted side, the diagram corresponding to the important part of FIG. 1.

The structure for mounting a printed board according to a first embodiment of the present invention will be described with reference to FIGS. 1 through 3. FIG. 1 is a perspective view schematically illustrating the structure for mounting a printed board (the positioning of a printed board and the electromagnetic shielding structure thereof) according to the first embodiment of the present invention. FIG. 2 is a partially sectional view of a plurality of sub printed boards viewed from the board width direction, the plurality of sub printed boards being juxtaposed to one another in the structure for mounting a printed board according to the first embodiment of the present invention. FIG. 3 is a diagram of a sub printed board viewed from the element mounting side, the sub printed board being based on the structure for mounting a printed board according to the first embodiment of the present invention.

FIG. 1 partially illustrates electronic apparatus in which a multiplicity of sub printed boards 4 are juxtaposed to one another, and in which each of the sub printed boards 4 is connected to a main printed board 1 by use of connectors 2, 3, the main printed board 1 being secured to a metal backboard 5. Each of the sub printed boards 4 includes: a semiconductor device area on which a multiplicity of semiconductor devices 8 are mounted, each of the semiconductor devices 8 being formed of, for example, a semiconductor radiation detector for detecting a radioactive ray; an electronic part area on which a plurality of electronic parts 9 (including a resistor, a capacitor 9e, an analog ASIC 9a, an ADC circuit, and digital ASICs 9b, 9c) are mounted.

To be more specific, as shown in FIG. 1, the main printed board 1 secured to the backboard 5 is equipped with a unit integration FPGA (Field Programmable Gate Array) (not shown) that is an integrated circuit used for unit integration. Digital information, which is obtained from the unit integration FPGA, is transmitted to a higher-level data processor (not shown) through wiring for information transmission, which is connected to a connector (not shown). In addition, in order to transmit packet data to the unit integration FPGA mounted on the main printed board 1, the connectors 2, the number of which corresponds to the number of the sub printed boards 4, are juxtaposed to one another on the main printed board 1. Here, the packet data is digital information obtained from each of the multiplicity of sub printed boards 4. Moreover, the power is supplied to the sub printed board 1 through the main printed board 1 that is connected to an outside power source.

Moreover, the multiplicity of sub printed boards 1 which are juxtaposed to one another are connected to the main printed board 1 by use of the connectors 2, 3, the main printed board 1 being secured to the metal backboard 5. Each of the sub printed boards 1 includes: the semiconductor device area on which the multiplicity of semiconductor devices 8 are arrayed in matrix (in a lattice-shaped pattern); and the electronic part area on which the plurality of electronic parts 9 (9a through 9e) are mounted. To be more specific, each of the connectors 3 is attached to a position in proximity to the trailing end (upper end) of the electronic part area on which the electronic parts 9 are mounted, the position being on the main printed board side of each of the sub printed boards 4. Then, by inserting each of the connectors 3 into each of the connectors 2 which are juxtaposed to one another on the main printed board 1 so that a connection between each of the sub printed boards 4 and the main printed board 1 are made, the electronic part area in each of the sub printed boards 4 is positioned, and at the same time, part of one end face in proximity to the boundary between the semiconductor device area and the electronic part area included in each of the sub printed boards 4 fits into each of comb-teeth-shaped grooves of a metal comb-teeth frame (a first metal frame) 5a that is formed in the leading edge (lower end) of the metal backboard 5 in a unified manner. Next, by inserting part of the other end face, which is located at a position in proximity to the boundary between the semiconductor device area and the electronic part area included in each of the sub printed boards 4, into each of comb-teeth-shaped grooves of a metal rod-shaped comb-teeth frame (a second metal frame) 6, and then by securely fastening, with screws (fastening means) 7, both ends of the metal rod-shaped comb-teeth frame 6 to legs 5b formed at both ends of the lower part of the metal backboard 5, both of the metal comb-teeth frames 5a, 6 slightly bend, which causes parts of both ends of the semiconductor device area of each of the sub printed boards 4 to securely fit into the comb-shaped grooves of both of the metal frames 5a, 6. As a result, an area in proximity to the upper end of the semiconductor device area on which the semiconductor devices 8 are mounted (an area in proximity to the boundary with the electronic part area), which is included in each of the sub printed boards 4, is positioned with respect to the metal backboard 5 with high accuracy.

In addition, as shown in FIG. 2, by placing metal plates 10 and electromagnetic shielding materials 11 at a height position of the legs 5b located on both ends of each of the sub printed boards 4 on which the semiconductor devices 8, the electronic parts 9, and the like, are mounted, a boundary is formed in an area in proximity to the boundary between the semiconductor device area on which the semiconductor devices 8 are mounted and the electronic part area on which the electronic parts 9 are mounted, and a boundary is also formed between the sub printed boards that are adjacent to each other. The metal plates 10 are secured with a solder joint material, or the like, at the height position of the legs 5b of each of the sub printed boards 4. Moreover, the electromagnetic shields 11 are provided to form a boundary between the leg 5b and the metal plate 10, and to form a boundary between the metal plates 10, so that the semiconductor device area of the sub printed board 4 is shielded. Incidentally, FIG. 2 illustrates a case where the semiconductor devices 8 are disposed on both sides of the sub printed board 4. However, it may also be so configured that the semiconductor devices 8 are disposed on one side of the sub printed board 4. Further, the legs 5b, which are used to secure both ends of the metal rod-shaped frame 6 with screws (fastening means) 7, are formed in a unified manner at both ends of the lower end of the metal backboard 5. However, the present invention is not limited to this embodiment. For example, the legs 5b may also be formed on the metal rod-shaped frame 6 in a unified manner.

In addition, as shown in FIG. 3, by providing the electromagnetic shielding materials 11 between the metal comb-teeth frame 5a and the metal plate 10, and between the metal rod-shaped comb-teeth frame 6 and the metal plate 10, a boundary is formed between each of the comb-teeth frames 5a, 6 and each end of the sub printed board 4. Thus, by covering with a metal cover 12 the semiconductor device area on which the semiconductor devices 8 of each of the multiplicity of the sub printed boards 4 are mounted, a boundary with the outside is formed. Moreover, by placing a vibration protection rubber 13 between the lower end (the leading end) of each of the sub printed boards 4 and the metal cover 13, and then by pressing the leading end of each of the sub printed boards 4 so that the leading end crawls into the vibration protection rubber 13, it is possible to prevent each of the sub printed boards 4 from vibrating, and to protect the semiconductor devices 8 against vibrations including mechanical vibrations in the system, and earthquake waves.

As described above, according to the first embodiment of the present invention, in the electronic apparatus in which the semiconductor devices 8 are mounted on each of the multiplicity of juxtaposed sub printed board 4 with high density, part of each end face in proximity to each semiconductor device area on which the semiconductor devices 8 are mounted is secured in a manner that the part of the end face is pinched between each comb-teeth-shaped groove of the metal comb-teeth frame 5a and each comb-teeth-shaped groove of the metal comb-teeth frame 6, the metal comb-teeth frame 5a being provided in an area in proximity to the lower end of the backboard 5 for securing the main printed board 1. This makes it possible to collectively correct the warping of the multiplicity of mounted sub printed boards 4, and to mount with high location accuracy the multiplicity of semiconductor devices on the semiconductor device area of each of the sub printed boards 4. This enables the semiconductor devices to detect or transmit a signal with high location accuracy. In addition to it, the miniaturization and the high-density packaging become possible.

Moreover, according to the first embodiment of the present invention, the metal plate 10 and the electromagnetic shielding material 11 are provided between the electronic part area and the semiconductor device area included in the sub printed board 4 so that the space between the adjacent sub printed boards are filled up with the metal plate 10 and the electromagnetic shielding material 11. As a result, boundaries are formed between the electronic part area and the semiconductor device area, and between the adjacent sub printed boards. In addition to it, by covering with the metal cover 12 all of the multiplicity of juxtaposed sub printed boards 4, each of which includes the semiconductor devices and the semiconductor device area, a boundary with the outside is formed. As a result, it becomes possible to completely protect the semiconductor devices against the electromagnetic force, dust, and heat so that the semiconductor devices are not influenced by electronic parts for controlling the semiconductor devices, and are not subject to the influence of the electromagnetic force, dust, and heat coming from the outside.

Further, according to the first embodiment of the present invention, by providing the narrow space between the metal cover 12 and the leading end of each of the multiplicity of sub printed boards 4 with the vibration protection rubber 13 that is easy to become deformed, and then by pressing the leading end of each of the sub printed boards 4 so that the leading end crawls into the vibration protection rubber 13, it becomes possible to protect the semiconductor devices against vibrations so that the semiconductor devices are not subject to the influence of mechanical vibrations of the electronic apparatus, and the influence of earthquake waves.

Furthermore, according to the first embodiment of the present invention, the present invention can also be applied to a case where semiconductor devices, each of which is capable of detecting or transmitting a light beam, an electromagnetic wave, vibrations, and the like, are used as the semiconductor devices mounted to the sub printed board.

Second Embodiment

Next, a second embodiment of a nuclear medicine diagnosis system (for example, a PET system or a SPECT system), which has the structure for mounting a printed board according to the present invention, will be described with reference to FIG. 1.

The nuclear medicine diagnosis system (for example, a PET system or a SPECT system) according to the present invention includes: the sub printed board described in the first embodiment, which corresponds to the joint substrate described in JP-A-2005-106805 (the patent document 3); and the main printed board 1 described in the first embodiment, which is used as a top plate in this embodiment.

FIG. 1 is a diagram illustrating a basis configuration of an observation unit (detector unit) 20 that forms a camera in the PET system and the SPECT system. As a nuclear medicine diagnosis system, the PET system includes a camera (imaging unit), a data processor, and a display unit. A subject is imaged by use of the camera with the subject being placed on a bed. A multiplicity of semiconductor radiation detectors 8 are built into the camera. The semiconductor radiation detector 8 detects a radioactive ray (gamma ray) that is emitted from a body of the subject. The camera includes an integrated circuit (ASIC: Application Specific IC) for measuring a crest value of the radioactive ray, and the detection time. Accordingly, the camera is capable of measuring a crest value of a detected radioactive ray (gamma ray), and the detection time. The data processor (not illustrated) acquires data including the crest value of the detected radioactive ray, and the detection time, and also acquires packet information including an ID of the above-described detector (channel). A simultaneous measurement device in the data processor performs simultaneous measurements on the basis of this packet information (in particular, data of the detection time, and the detector ID), and then creates tomogram information of the subject by use of counted values (count information) acquired as a result of the simultaneous measurements, and position information of the detector at a point of time at which the radioactive ray is detected. After that, the packet information, the counted values acquired as a result of the simultaneous measurements, the position information of the detector, the tomogram information, and the like, are stored in a storage device. In addition, a tomogram information creation device (not shown) in the data processor creates a function image (tomogram) on the basis of a detected position of this detector, and then displays the function image on the display unit (not shown).

Inside the camera, the multiplicity of observation units (detector units) 20, each of which houses the plurality of sub printed boards 4, are located in the shape of a circumference so that a radioactive ray emitted from the subject is detected. The plurality of sub printed boards 4, each of which has a semiconductor device area on which the multiplicity of semiconductor radiation detectors 8 are disposed in a lattice-shaped pattern, are connected through connectors to the main printed board 1 that is secured to the metal backboard 5. The subject lying on the bed is located at the center of the camera. At this time, semiconductor radiation detector groups, each of which is mounted on each of the plurality of sub printed boards, surround the bed. Here, the plurality of sub printed boards are included in each of the multiplicity of observation units 20 located in the shape of a circumference. It is so devised that crest-value information of a radioactive ray, which is obtained on the basis of a detection signal generated when the semiconductor radiation detector 8 interacts with the radioactive ray, and time information at the time of detecting the radioactive ray, and address information (detector ID) of the radiation detector 8 are output from the observation unit 20 for each radiation detector 8 included in the observation unit 20.

Next, the multiplicity of sub printed boards 4 which are disposed in the observation unit 20 will be described. Each of the sub printed board 4 is provided with on-board elements including: a plurality of radiation detectors 8 that are analog signal circuits, the radiation detectors 8 being disposed on one side (surface) or both sides of the sub printed board 4; an analog ASIC 9a that is a LSI constituted of a multiplicity of analog signal processing circuits, each of which performs processing of, for example, amplifying an analog signal whose amplitude is minute, the analog signal being output from each of the radiation detectors 8; and an analog-digital hybrid circuit including a plurality of ADC circuits, each of which converts each of the plurality of analog signals (crest values) into a digital signal, the analog signals being subjected to the processing of, for example, the amplification by the analog ASIC 9a; and a digital signal circuit 9c having a digital ASIC that is a LSI constituted of a data transmission circuit and a plurality of packet data generators including a plurality of time information generation circuits and an ADC control circuit. A connection between each of the plurality of radiation detectors 8 and the analog-digital hybrid circuit is made by a plurality of analog signal wiring lines. A connection between the analog-digital hybrid circuit and the digital signal circuit is made by digital signal wiring.

The analog ASIC 9a is connected to the plurality of radiation detectors 8 by analog signal wiring. The analog signal processing circuit including a slow system and a fast system is provided corresponding to the radiation detectors 8. The slow system first amplifies the minute amplitude signal detected by the radiation detector 8. The amplified signal is then subjected to shaping, and the like, before a crest value of a radioactive ray is determined. After that, the crest value is held in a peak-hold circuit. The held crest value of the radioactive ray is supplied to the ADC circuit through wiring. The crest value is then converted into a digital crest value, which is transmitted to a plurality of packet data generators of the digital ASIC of the digital signal circuit through the digital signal wiring. The fast system outputs a timing signal used to identify the detection time of a radioactive ray, and then supplies the timing signal to the digital ASIC (digital circuit used for data processing) of the digital signal circuit through the digital signal wiring.

All digital ASICs which are provided in the PET system operate in synchronization with one another in response to a clock signal received from a clock generator. The clock signal which has been inputted into each of the digital ASICs is inputted into each time information generation circuit included in each of all packet data generators. The time information generation circuit determines the detection time (time information) of the radioactive ray on the basis of a clock signal at a point of time at which the timing signal is inputted from the fast system of the analog ASIC 9a. The ADC control circuit 9b identifies a detector ID corresponding to the determination of the time, and converts the crest value of the radioactive ray into a digital crest value corresponding to the radiation detector ID identified in the ADC circuit, and then supplies the digital crest value to a packet data generator of the digital ASIC 9c through the digital signal wiring. Thus, each packet data generator can obtain packet data (integration information) including radiation detector ID information (detector position information), time information, and crest-value information. The packet data is then inputted into the data transmission circuit. Thus, the packet data, which is digital information obtained from the data transmission circuit, is transmitted through the connectors 3, 2 to an integrated circuit for unit integration (unit integration FPGA (Field Programmable Gate Array)) that is mounted on the main printed board 1. The unit integration FPGA (digital circuit used for data aggregations) transmits the digital information to the above-described data processor (not illustrated) through information transmission wiring connected to the connector.

As described above, according to the second embodiment, the structure for mounting a printed board provided in the observation unit, which is included in the nuclear medicine diagnosis system (for example, a PET system or a SPECT system), is configured similarly to that in the first embodiment. Accordingly, it becomes possible to mount the multiplicity of semiconductor radiation detectors with high location accuracy. This enables the semiconductor radiation detector to detect a signal with high location accuracy. In addition, the miniaturization and the high-density packaging become possible.

Moreover, according to the second embodiment of the present invention, it becomes possible to completely protect the semiconductor radiation detectors against the electromagnetic force, dust, and heat so that the semiconductor radiation detectors are not influenced by electronic parts for controlling the semiconductor radiation detectors, and are not subject to the influence of the electromagnetic force, dust, and heat coming from the outside.

Furthermore, according to the second embodiment of the present invention, it becomes possible to protect the semiconductor radiation detectors against vibrations so that the semiconductor radiation detectors are not subject to the influence of mechanical vibrations of the electronic apparatus, and the influence of earthquake waves.

As described above, according to the second embodiment of the present invention, it becomes possible to achieve the tomographic diagnosis based on the detection of a radioactive ray with high accuracy, and what is more, it becomes possible to realize a nuclear medicine diagnosis system including an observation unit that enables the miniaturization and the high-density packaging.

What is claimed is:

1. A structure for mounting a printed board, the structure comprising: a metal backboard; a main printed board that has a plurality of connectors mounted thereon and is fixed to the metal backboard, the plurality of connectors being juxtaposed to each other; a plurality of sub printed boards each having a connector adapted to be inserted into and connected with each of the connectors mounted on the main printed board so as to be mounted on the main printed board; a first metal frame attached to the metal backboard and having a plurality of first grooves; and a second metal frame separate from the metal backboard and having a plurality of second grooves; wherein each of the sub printed boards includes a semiconductor device area on which a plurality of semiconductor devices are mounted, and an electronic part area on which a plurality of electronic parts are mounted; wherein when the connector of each of the sub printed boards is connected to each connector mounted on the main printed board, a first edge of each sub printed board is received in a respective first groove of the first metal frame and a second edge of said each sub printed board is received in a respective second groove of the second metal frame, the second edge being opposite the first edge, and the first and second edges of each of the sub printed boards are pinched between the first metal frame and the second metal frame, and the second metal frame is detachably secured to the metal backboard by use of fastening means, wherein the main printed board is pinched between the first metal frame and the second metal frame; and wherein a first side of the sub printed board is partially fixed to the first frame and partially fixed to the connector and a second side of the sub board is partially fixed to the second frame; wherein an electromagnetic shielding material is placed in a space between the first metal flame and the end of each of the sub printed boards to fill up the space with the electromagnetic shielding material, and an electromagnetic shielding material is placed in a space between the second metal flame and the end of each of the sub printed boards to fill up the space with the electromagnetic shielding material, so that a first boundary is formed between the end of each of the sub printed boards and the first metal frame, and between the end of each of the sub printed boards and the second metal frame; wherein a metal plate and an electromagnetic shielding material are placed in an area in proximity to a boundary between the electronic part area and the semiconductor device area on both sides of each of the sub printed boards to fill up the space between adjacent sub printed boards with the metal plate and the electromagnetic shielding material, so that a second boundary is formed between the adjacent sub printed boards in the area in proximity to the boundary between the electronic part area and the semiconductor device area; and wherein all of the semiconductor device areas of the plurality of sub printed boards, which are sectioned by the first and second boundaries, are covered with a metal cover.

2. The structure for mounting a printed board according to claim 1 wherein: a leading end of each of the plurality of sub printed boards is pressed with a rubber material.

3. A nuclear medicine diagnosis system comprising an observation unit for observing a radioactive ray emitted from a subject and for performing tomographic diagnosis, wherein the observation unit has a structure for mounting a printed board, the structure including a metal backboard, a main primed board that has a plurality of connectors mounted thereon and is fixed to the metal backboard and juxtaposed to each other, and a plurality of sub primed boards each having a connector that is adapted to be inserted into and connected with each of the connectors mounted on the main primed board so as to be mounted on the main primed board;
  wherein a first metal frame is attached to the metal backboard and comprises a plurality of first grooves;
  wherein the structure further includes a second metal frame separate from the metal backboard and having a plurality of second grooves;
  wherein each of the sub printed boards includes a semiconductor device area on which a plurality of semiconductor devices are mounted, and an electronic part area on which a plurality of electronic parts are mounted;
  wherein when the connector of each of the sub primed boards is connected to each connector mounted on the main printed board, a first edge of each sub primed board is received in a respective first groove of the first metal frame and a second edge of said each sub primed board is received in a respective second groove of the second metal frame, the second edge opposite the first edge, and the first and second edges of each of the sub primed boards are pinched between the first metal frame and the second metal frame, and the second metal frame is detachably secured to the metal backboard by use of fastening means~wherein the main printed board is pinched between the first metal frame and the second metal frame;
  wherein a plurality of arrayed semiconductor radiation detectors that each detect a radioactive ray are mounted on the semiconductor device area of each of the sub printed boards; and
  wherein an analog integrated circuit, an analog-digital hybrid circuit and a digital signal circuit are mounted on the electronic part area of each of the sub printed boards, the analog integrated circuit being adapted to at least amplify a radioactive-ray detection signal that is output from each of the semiconductor radiation detectors, the analog-digital hybrid circuit having an ADC circuit for converting the amplified radioactive-ray signal into a digital; wherein an electromagnetic shielding material is placed in a space between the first metal frame and the end of each of the sub printed boards to fill up the space with the electromagnetic shielding material, and an electromagnetic shielding material is placed in a space between the second metal frame and the end of each of the sub printed boards to fill up the space with the electromagnetic shielding material, so that a first boundary is formed between the end of each of the sub printed boards and the first metal frame, and between the end of each of the sub printed boards and the second metal frame; wherein a metal plate and an electromagnetic shielding material are placed in an area in proximity to a boundary between the electronic part area and the semiconductor device area on both sides of each of the sub printed boards to fill up the space between adjacent sub printed boards with the metal plate and the electromagnetic shielding material, so that a second boundary is formed between the adjacent sub printed boards in the area in proximity to the boundary between the electronic part area and the semiconductor device area; and wherein all of the semiconductor device areas of the plurality of sub printed boards, which are sectioned by the first and second boundaries, are covered with a metal cover.

4. The structure for mounting a printed board according to claim 3 wherein: a leading end of each of the plurality of sub printed boards is pressed with a rubber material.

5. The nuclear medicine diagnosis system according to claim 3, wherein
  a leading end of each of the plurality of sub printed boards is pressed with a rubber material.

6. A structure for mounting a printed circuit board, the structure comprising: a metal backboard; a main printed board that has a plurality of connectors mounted thereon and is fixed to the metal backboard, the plurality of connectors being juxtaposed to each other; and a plurality of sub printed boards each having a connector adapted to be inserted into and connected with each of the connectors mounted on the main printed board so as to be mounted on the main printed board; wherein each of the sub printed boards includes a semiconductor device area on which a plurality of semiconductor devices are mounted, and an electronic part area on which a plurality of electronic parts are mounted; wherein a first metal frame integrated into the metal backboard being formed in such a manner that first comb-teeth-shaped grooves are formed correspondingly to the plurality of sub printed boards that are juxtaposed to one another, a second metal frame separated from the metal backboard being formed in a rod-shape and in such a manner that second comb-teeth-shaped grooves are formed correspondingly to the plurality of sub printed boards that are juxtaposed to one another, the second metal rod-shaped frame facing the first metal frame wherein the main printed board is pinched between the first metal frame and the second metal frame; and wherein when the connector of each of the sub printed boards is connected to each connector mounted on the main printed board, part of one end of the sub printed boards is fitted into each of the first comb-teeth-shaped grooves of the first metal frame, and part of the other end of each of the sub printed boards is fitted into each of the second comb-teeth-shaped grooves of the second metal rod-shaped frame, edge being opposite the first edge, and one side, having the connector, of the sub printed boards are partially fixed to the first metal frame with the first comb-teeth-shaped grooves and another side of the sub printed boards are partially fixed to the second metal rod-shaped frame with the first comb-teeth-shaped grooves, and both ends of the second metal rod-shaped frame is secured to the metal backboard by use of fastening means; wherein an electromagnetic shielding material is placed in a space between the first metal frame and the end of each of the sub printed boards to fill up the space with the electromagnetic shielding material, and an electromagnetic shielding material is placed in a space between the second metal frame and the end of each of the sub printed boards to fill up the space with the electromagnetic shielding material, so that a first boundary is formed between the end of each of the sub printed boards and the first metal frame, and between the end of each of the sub printed boards and the second metal frame; wherein a metal plate and an electromagnetic shielding material are placed in an area in proximity to a boundary between the electronic part area and the semiconductor device area on both sides of each of the sub printed boards to fill up the space between adjacent sub printed boards with the metal plate and the electromagnetic shielding material, so that a second boundary is formed between the adjacent sub printed boards in the area in proximity to the boundary between the electronic part area and the semiconductor device area; and wherein all of the semiconductor device areas of the plurality of sub printed boards, which are sectioned by the first and second boundaries, are covered with a metal cover.

* * * * *